United States Patent
Takahashi et al.

(10) Patent No.: US 12,366,611 B2
(45) Date of Patent: Jul. 22, 2025

(54) ARC DETECTION SYSTEM, ARC DETECTION METHOD, AND RECORDING MEDIUM

(71) Applicant: Panasonic Intellectual Property Management Co., Ltd., Osaka (JP)

(72) Inventors: Tatsuya Takahashi, Tokyo (JP); Tatsuo Koga, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 183 days.

(21) Appl. No.: 18/249,334

(22) PCT Filed: Oct. 5, 2021

(86) PCT No.: PCT/JP2021/036857
§ 371 (c)(1),
(2) Date: Apr. 17, 2023

(87) PCT Pub. No.: WO2022/091717
PCT Pub. Date: May 5, 2022

(65) Prior Publication Data
US 2023/0393218 A1    Dec. 7, 2023

(30) Foreign Application Priority Data
Oct. 29, 2020 (JP) ................. 2020-181860

(51) Int. Cl.
*G01R 31/08* (2020.01)
*G01R 31/58* (2020.01)
*H04B 3/46* (2015.01)

(52) U.S. Cl.
CPC ........... *G01R 31/58* (2020.01); *G01R 31/086* (2013.01); *H04B 3/46* (2013.01)

(58) Field of Classification Search
CPC ............................ G01R 31/58; G01R 31/086
See application file for complete search history.

(56) References Cited

U.S. PATENT DOCUMENTS

2004/0004848 A1* 1/2004 Yuzurihara ......... H02M 3/3376
                                                                363/16
2011/0043214 A1* 2/2011 Potter .................. H02H 1/0015
                                                                324/525
(Continued)

FOREIGN PATENT DOCUMENTS

EP      2960947 A1    12/2015
JP     2011-007765 A    1/2011

OTHER PUBLICATIONS

Extended European Search Report dated Apr. 25, 2024 issued in the corresponding European Patent Application No. 21885836.3.
(Continued)

*Primary Examiner* — Alesa Allgood
(74) *Attorney, Agent, or Firm* — Rimon P.C.

(57) ABSTRACT

An arc detection system includes a first obtainment unit, a second obtainment unit, and a determination unit. The first obtainment unit obtains a measurement result of current flowing in a power line to which power is supplied from a power supply or a measurement result of voltage in the power line. The second obtainment unit obtains quality information about the quality of communication with a device connected to the power line through power line communication with the device via the power line. The determination unit determines whether or not an arc fault has occurred in the power line based on components in a specific frequency band of the measurement result obtained by the first obtainment unit and the quality information obtained by the second obtainment unit.

13 Claims, 3 Drawing Sheets

(56) References Cited

U.S. PATENT DOCUMENTS

2013/0242450 A1\* 9/2013 Mills .................. H01H 71/68
200/290
2015/0381111 A1\* 12/2015 Nicolescu ............. H02H 7/20
324/761.01

OTHER PUBLICATIONS

International Search Report issued on Dec. 21, 2021 in International Patent Application No. PCT/JP2021/036857, with English translation.

\* cited by examiner

ARC DETECTION SYSTEM, ARC DETECTION METHOD, AND RECORDING MEDIUM

CROSS-REFERENCE OF RELATED APPLICATIONS

This application is the U.S. National Phase under 35 U.S.C. § 371 of International Patent Application No. PCT/JP2021/036857, filed on Oct. 5, 2021, which in turn claims the benefit of Japanese Patent Application No. 2020-181860, filed on Oct. 29, 2020, the entire disclosures of which applications are incorporated by reference herein.

TECHNICAL FIELD

The present invention relates to an arc detection system, an arc detection method, and a recording medium for determining whether or not an arc fault may possibly occur in a power line.

BACKGROUND ART

PTL 1 discloses an arc detection means for detecting arcs. The arc detection means includes a voltage detection means for measuring the voltage between the input side wiring to the terminal block and the output side wiring from the terminal block, and a current detection means for measuring the current in the output side wiring from the terminal block. The arc detection means differentiates between electrical noise, etc., and arcs on the terminal block by simultaneously detecting fluctuations in the voltage value in the voltage detection means and fluctuations in the current value in the current detection means.

CITATION LIST

Patent Literature

[PTL 1] Japanese Unexamined Patent Application Publication No. 2011-7765

SUMMARY OF INVENTION

Technical Problem

The present invention provides an arc detection system, an arc detection method, and a recording medium that facilitate the prevention of false detection of the occurrence of arc faults.

Solution to Problem

An arc detection system according to one aspect of the present invention includes a first obtainment unit, a second obtainment unit, and a determination unit. The first obtainment unit is configured to obtain a measurement result of current flowing in a power line to which power is supplied from a power supply or a measurement result of voltage in the power line. The second obtainment unit is configured to obtain quality information about quality of communication with a device connected to the power line through power line communication with the device via the power line. The determination unit is configured to determine whether or not an arc fault has occurred in the power line based on components in a specific frequency band of the measurement result obtained by the first obtainment unit and the quality information obtained by the second obtainment unit.

An arc detection method according to one aspect of the present invention includes: obtaining a measurement result of current flowing in a power line to which power is supplied from a power supply or a measurement result of voltage in the power line; obtaining quality information about quality of communication with a device connected to the power line through power line communication with the device via the power line; and determining whether or not an arc fault has occurred in the power line based on components in a specific frequency band of the measurement result obtained and the quality information obtained.

A non-transitory computer-readable recording medium according to one aspect of the present invention has recorded thereon a program for causing one or more processors to execute the arc detection method described above.

Advantageous Effects of Invention

One aspect of the present invention has the advantage that it is easy to prevent false detection of the occurrence of arc faults.

DESCRIPTION OF EMBODIMENTS

The following describes embodiments of the present invention with reference to the drawings. The embodiments described below each show a specific example of the present invention. The numerical values, shapes, materials, elements, the arrangement and connection of the elements, steps, the order of the steps, etc., indicated in the following embodiments are mere examples, and therefore do not intend to limit the present invention.

Note that the respective figures are schematic diagrams and are not necessarily precise illustrations. Additionally, like reference signs indicate like elements. As such, overlapping explanations of like elements are omitted or simplified.

[Configuration]

Figure 1:
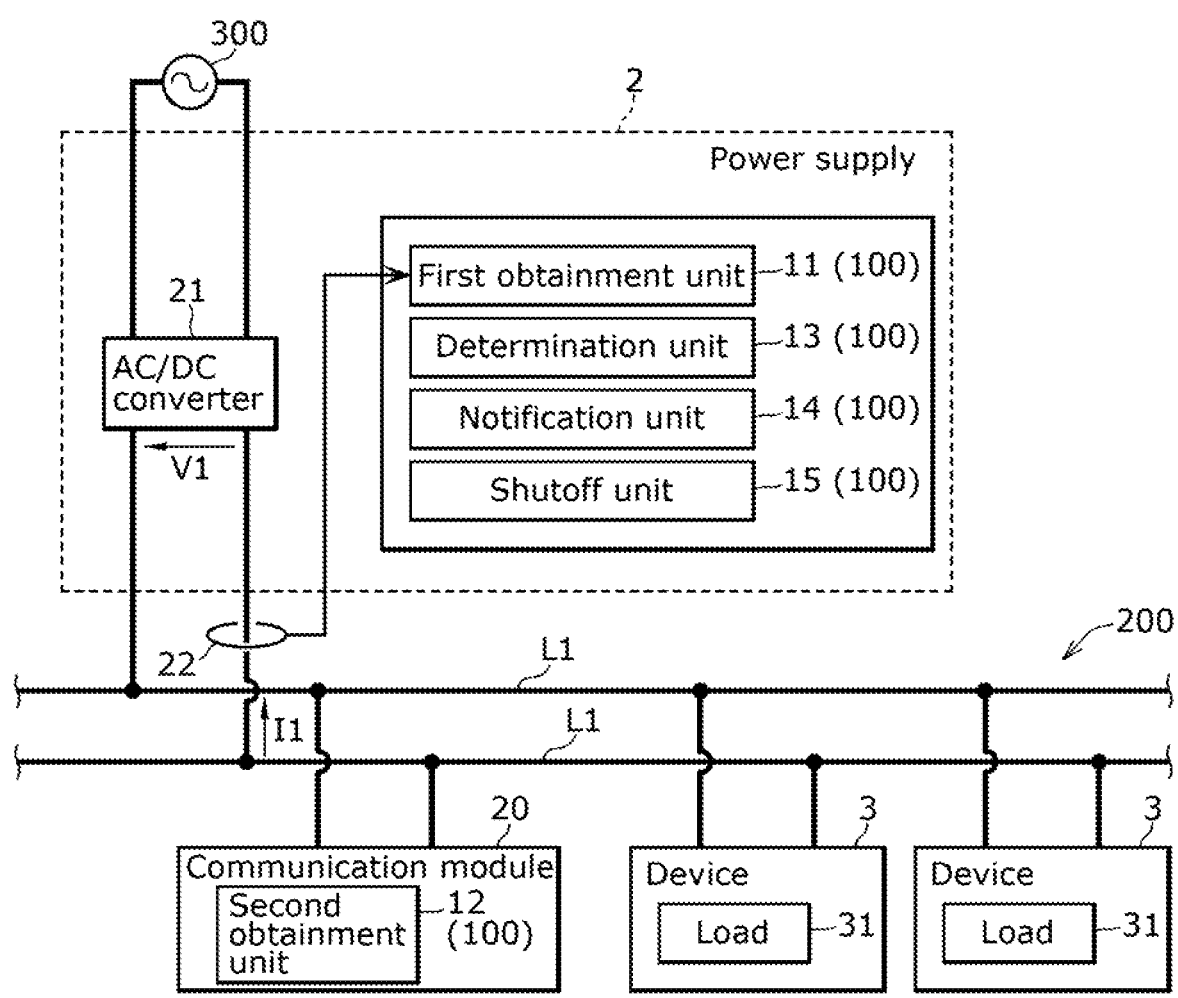
FIG. 1 is a diagram of the overall structure including an arc detection system according to an embodiment of the present disclosure.

The arc detection system according to the embodiment will be described with reference to FIG. 1. FIG. 1 is a diagram of the overall structure including arc detection system 100 according to the embodiment.

Arc detection system 100 is primarily a system for determining whether or not an arc fault has occurred in power line L1 to which power is supplied from the power supply 2. Stated differently, power line L1 may be damaged or broken by, for example, external factors or age-related deterioration, and arcing (arc discharge) may occur due to such damage, ultimately resulting in an arc fault. Arc detection system 100 is therefore primarily used to detect arc faults that may occur in power line L1.

More specifically, arc detection system 100 is used in what is known as direct current (DC) distribution network 200. DC distribution network 200 includes one or more power lines L1. FIG. 1 illustrates an example in which DC distribution network 200 includes only one power line L1. DC power is supplied to DC distribution network 200 from power supply (in this case, a DC power supply) 2. Each power line L1 includes a pair of power lines: a positive power line connected to the positive electrode on the output side of power supply 2 and a negative power line connected to the negative electrode on the output side of power supply 2.

Here, if DC distribution network 200 includes only one power line L1, DC power is supplied from power supply 2 to this power line L1. If DC distribution network 200 includes a plurality of power lines L1, one end of each power line L1 is connected to one or more branch points. Therefore, when DC power is supplied from power supply 2 to one of power lines L1, DC power is also supplied to the other power lines L1 through the one or more branch points.

In the embodiment, power supply 2 is a power converter including AC/DC converter 21. Power supply 2 converts AC power output from power grid 300 into DC power and outputs the converted DC power to power line L1 to which power supply 2 is connected. If DC distribution network 200 includes a plurality of power lines L1, the DC power output to the above-described power line L1 is also output to the other power lines L1. In the embodiment, power supply 2 may be configured to output DC power, and may be a distributed power supply such as solar cells, a power supply such as storage batteries, or a combination of these power supplies and a power converter (for example, a power converter that includes a DC/DC converter circuit).

Each power line L1 is configured as a duct rail, for example, to which one or more devices 3 can be attached. Stated differently, one or more devices 3 can be arranged in any position on each power line L1. Each power line L1 may of course be configured such that locations where one or more devices 3 can be attached are defined in advance. In the embodiment, each power line L1 is located on the ceiling of a facility, but each power line L1 may be located on the floor, a wall, or a fixture in the facility.

Device 3 includes load 31 and a pair of connecting terminals. Device 3 also includes a function for communicating with second obtainment unit 12 (described below) of arc detection system 100. The communication function is realized when device 3 is operating. In other words, in the embodiment, device 3 can communicate with second obtainment unit 12 when device 3 is connected to power line L1, but cannot communicate with second obtainment unit 12 when it is not connected to power line L1.

Device 3 can be attached to or detached from power line L1 via the pair of connecting terminals. More specifically, when attaching device 3 to power line L1, device 3 is rotated clockwise or counterclockwise by a predetermined angle (for example, 90 degrees) in a view from the direction of insertion of device 3, with the pair of connecting terminals of device 3 inserted into the duct rail (power line L1). This fixes the pair of connecting terminals in place while they are in contact with a pair of connecting conductors provided in power line L1, thereby electrically and mechanically connecting device 3 to power line L1.

Device 3 is detached from power line L1 by rotating device 3 by a predetermined angle in a view from the direction of insertion of device 3, in the opposite direction from that described above. This releases the contact between the pair of connecting terminals and the pair of connecting conductors, enabling device 3 to be detached from power line L1. Load 31 is driven by the DC power supplied from power supply 2 via power line L1 when device 3 is attached to power line L1.

In the embodiment, device 3 is a lighting fixture, but device 3 may be, for example, a loudspeaker, a camera, a sensor, or a USB power delivery (PD). Stated differently, device 3 may be a device other than a lighting fixture as long as load 31 is driven by electric power. In the embodiment, all of devices 3 connected to power lines L1 are lighting fixtures, i.e., are of one type of device, but a plurality of types of devices 3 may be connected to power lines L1. For example, a lighting fixture, a loudspeaker, a camera, a sensor, and a USB PD may be connected to power lines L1. These devices 3 may be all connected to a single power line L1, or they may be connected separately to a plurality of power lines L1.

Arc detection system 100 includes first obtainment unit 11, second obtainment unit 12, determination unit 13, notification unit 14, and shutoff unit 15 as functional components for determining whether an arc fault has occurred. In the embodiment, first obtainment unit 11, determination unit 13, notification unit 14, and shutoff unit 15 are provided in power supply 2. Second obtainment unit 12 is provided in communication module 20, which is connected to power line L1, rather than in power supply 2. Communication module 20 is configured to communicate with power supply 2 by, for example, wireless communication or power line communication (PLC).

In each of power supply 2 and communication module 20, arc detection system 100 is, for example, a microcontroller or a device that includes a microcontroller. A microcontroller is a semiconductor integrated circuit, etc., that includes ROM in which a program is stored, RAM, a processor (a central processing unit (CPU)) that executes the program, a timer, an A/D converter, and a D/A converter. First obtainment unit 11, second obtainment unit 12, determination unit 13, notification unit 14, and shutoff unit 15 are all realized by the processor executing the above program.

First obtainment unit 11 obtains a measurement result of current I1 flowing in power line L1 or voltage V1 in power line L1 to which power is supplied from power supply 2. In the embodiment, first obtainment unit 11 obtains the measurement result of current I1 by sampling at predetermined intervals (i.e., on a sampling cycle) by current meter 22. Stated differently, first obtainment unit 11 obtains the measurement result of current I1 from current meter 22 at predetermined intervals. Current meter 22 is provided between power supply 2 and power line L1, and measures the current flowing in the negative power line of power line L1 (i.e., current I1 in power line L1). Current meter 22 may be built into power supply 2.

Second obtainment unit 12 obtains quality information about the quality of communication with devices 3 connected to power line L1 through power line communication with devices 3 via power line L1. The communication standard used for power line communication between second obtainment unit 12 and device 3 is not particularly limited. In the embodiment, the quality information includes the level of power line communication quality between second obtainment unit 12 and device 3, where the level of communication quality is represented by the frequency of communication errors. In other words, second obtainment unit 12 obtains the frequency of communication errors as the quality information. Communication errors may include, for example, the inability to receive signals transmitted unilaterally from device 3, or the reception of only a portion of the data even if the signal is received. Communication errors may include, for example, when a request signal including a command requesting a reply is transmitted from second obtainment unit 12 to device 3, the failure to receive a response signal from device 3 to which the request signal was transmitted, or the reception of only a portion of the data even if a response signal is received.

The frequency of communication errors is expressed by the number of times a communication error occurs per unit of time (for example, one minute, several minutes, one hour, or several hours) or the number of request retries from second obtainment unit 12 to device 3 per unit of time. Stated differently, the less the frequency of communication errors, the higher the level of communication quality, and the greater the frequency of communication errors, the lower the level of communication quality.

In the embodiment, second obtainment unit 12 communicates at regular intervals (for example, every several hundred milliseconds) with devices 3 that are connected to power line L1 and operating.

For example, second obtainment unit 12 may communicate with devices 3 by receiving signals unilaterally transmitted from devices 3 that are connected to power line L1 and operating. For example, second obtainment unit 12 may communicate with devices 3 by broadcasting a request signal and receiving a response signal from device 3 that received the request signal.

The signal transmitted from device 3 toward second obtainment unit 12 includes information identifying the source device 3. Arc detection system 100 is therefore able to know the quality information for each device 3.

Determination unit 13 determines whether or not an arc fault has occurred in power line L1 based on components in a specific frequency band of the measurement result obtained by first obtainment unit 11 and the quality information obtained by second obtainment unit 12. More specifically, determination unit 13 performs a frequency analysis of the measurement result of current I1 obtained by first obtainment unit 11. Frequency analysis involves, for example, calculating the frequency spectrum of the measurement result of current I1 by calculating the Fourier transform (in this case, Fast Fourier Transform (FFT)) of the time waveform of the measurement result of current I1. Determination unit 13 then refers to the calculated frequency spectrum and determines that an arc has occurred if the measurement result of current I1 contains a first predetermined value of specific frequency band components or more. The specific frequency band is, for example, a band that includes the frequency of noise generated when an arc occurs. In one example, the specific frequency band is the band of tens of kHz, which is a relatively high frequency band. Note that the frequency of the noise generated in the above case can be obtained experimentally.

Determination unit 13 then determines whether or not an arc fault has occurred in power line L1 by referencing not only the determination of whether or not an arc has occurred based on the measurement result obtained by first obtainment unit 11, but also the quality information obtained by second obtainment unit 12. In other words, determination unit 13 does not determine that an arc fault has occurred in power line L1 simply by determining that an arc has occurred based on the measurement result obtained by first obtainment unit 11. The following is an explanation of how the inventors came to determine the occurrence of arc faults in this manner.

There are two types of arcs that can occur in DC distribution network 200: arcs that result from a disconnection or partial disconnection in power line L1, and arcs that can occur momentarily when attaching or detaching device 3 to or from power line L1. Stated differently, if device 3 is not smoothly attached to power line L1, chattering—where load 31 in device 3 is repeatedly connected to and disconnected from power line L1 in a short period of time—can occur. While chattering is occurring, an arc can occur when load 31 is momentarily disconnected from power line L1 while current is flowing therethrough. Chattering can also occur when detaching device 3 from power line L1, as described above. While chattering is occurring, an arc can occur when load 31 is momentarily disconnected from power line L1 while current is flowing therethrough. The generation of arcs due to such chattering can occur not only in DC distribution network 200, but also in an alternating current (AC) distribution network. In particular, if device 3 is attached to power line L1 with an unsatisfactory distance between the electrodes of device 3 and the electrodes of power line L1, it is difficult for the arc to extinguish.

In DC distribution network 200, when an arc occurs due to a disconnection or partial disconnection in power line L1, components in a specific frequency band are superimposed on current I1 (or voltage V1). Determination unit 13 can therefore determine that an arc has occurred by monitoring specific frequency band components of current I1 (or voltage V1). However, even in cases of an abrupt fluctuation in load 31 included in device 3, it is possible for specific frequency band components to be superimposed on current I1 (or voltage V1). Such a phenomenon can occur not only in DC distribution network 200, but also in an AC distribution network.

Arcs caused by a disconnection or partial disconnection in power line L1 tend to cause arc faults, but the above phenomenon is not caused by the occurrence of arcs in power line L1 in the first place, and is thus not a cause of arc faults. Arcs caused by chattering are unlikely to cause arc faults because they generally extinguish in a short period of time. It is therefore desirable for arc detection system 100 to ignore short duration arcs caused by chattering and the above-described phenomenon, and primarily determine the occurrence of an arc caused by a disconnection or partial disconnection in power line L1 as the occurrence of an arc fault.

In view of this, in the embodiment, in order to satisfy the above requirement, determination unit 13 determines whether or not an arc fault has occurred in power line L1 as follows. Determination unit 13 first determines whether or not an arc has occurred based on a measurement result obtained by first obtainment unit 11. If determination unit 13 determines that an arc has occurred, it monitors the duration of the determination that an arc has occurred. If the duration is less than a first threshold, determination unit 13 determines that an arc fault has not occurred in power line L1, regardless of the quality information obtained by second obtainment unit 12. If the duration is greater than or equal to the first threshold and less than a second threshold, determination unit 13 determines whether or not an arc fault has occurred in power line L1 as described in the first determination example or the second determination example below. If the duration is greater than or equal to the second threshold, determination unit 13 determines whether or not an arc fault has occurred in power line L1 as described in the third determination example below. The first threshold and the second threshold are set in advance, for example, by the user of arc detection system 100.

Figure 2A:
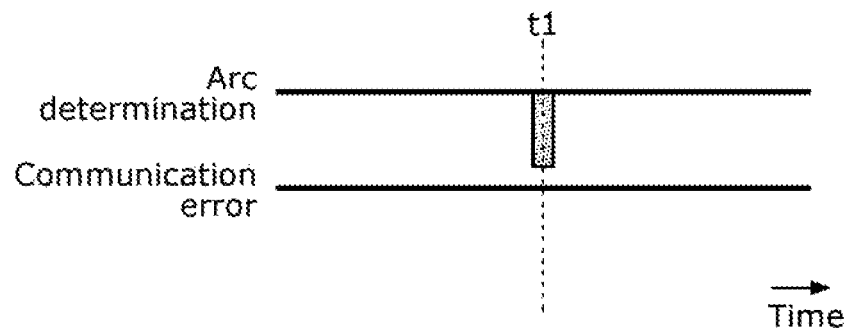
FIG. 2A is a timing chart illustrating a first determination example by a determination unit of the arc detection system according to an embodiment of the present disclosure.
Figure 2B:
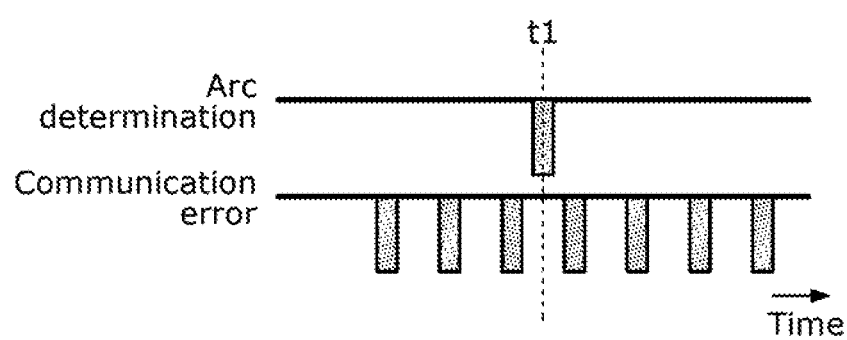
FIG. 2B is a timing chart illustrating a second determination example by the determination unit of the arc detection system according to an embodiment of the present disclosure.
Figure 2C:
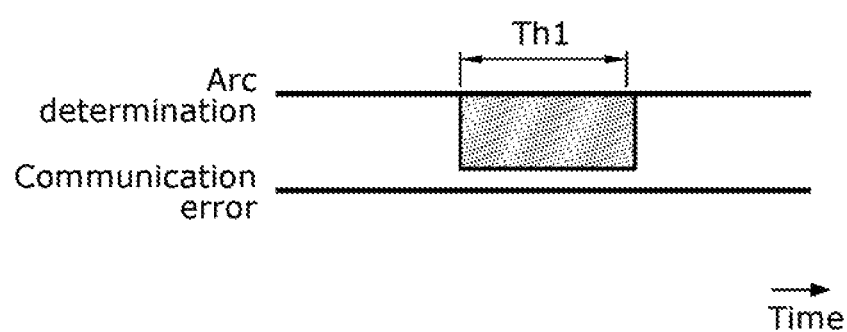
FIG. 2C is a timing chart illustrating a third determination example by the determination unit of the arc detection system according to an embodiment of the present disclosure.

FIG. 2A is a timing chart illustrating the first determination example by determination unit 13 of arc detection system 100 according to the embodiment. FIG. 2B is a timing chart illustrating the second determination example by determination unit 13 of arc detection system 100 according to the embodiment. FIG. 2C is a timing chart illustrating the third determination example by determination unit 13 of arc detection system 100 according to the embodiment. In each of FIG. 2A through FIG. 2C, the pulses in the upper timing chart represent the duration of a determination that an arc has occurred by determination unit 13. In each of FIG. 2A through FIG. 2C, the pulses in the lower timing chart indicate an error in the power line communication between second obtainment unit 12 and device 3. In FIG. 2A and FIG. 2C, no pulses are illustrated because there are no power line communication errors between second obtainment unit 12 and device 3, as will be described below.

As illustrated in FIG. 2A, in the first determination example, at time t1, determination unit 13 determines that an arc has occurred based on the measurement result obtained by first obtainment unit 11. At time t1 (hereinafter also referred to as "determination time" t1), second obtainment unit 12 has obtained no or little quality information indicating a power line communication error with device 3. Therefore, in the first determination example, determination unit 13 determines that an arc has not occurred in power line L1 due to the high level of communication quality at determination time t1, and thus determines that an arc fault has not occurred in power line L1.

As illustrated in FIG. 2B, in the second determination example, at determination time t1, second obtainment unit 12 has frequently obtained quality information indicating a power line communication error with device 3. Therefore, in the second determination example, determination unit 13 determines that an arc caused by a disconnection or partial disconnection in power line L1 has occurred, i.e., an arc fault has occurred, because of the low level of communication quality at determination time t1.

Thus, in the first determination example and the second determination example, when determination unit 13 determines that an arc has occurred based on the measurement result obtained by first obtainment unit 11 and, at the time of the determination, the level of communication quality obtained by second obtainment unit 12 is low, determination unit 13 determines that an arc fault has occurred. Here, whether the level of communication quality is low or not is determined by whether the frequency of communication errors is greater than or equal to a threshold. More specifically, determination unit 13 determines that level of communication quality is high if the frequency of communication errors is less than the threshold, and determines that the level of communication quality is low if the frequency of communication errors is greater than or equal to the threshold. The threshold is set in advance, for example, by the user of arc detection system 100.

The term "at the time of the determination" does not include only the moment of determination time t1, but may include a range from a predetermined amount of time before determination time t1 to a predetermined amount of time after determination time t1.

As illustrated in FIG. 2C, in the third determination example, although quality information indicating a power line communication error between second obtainment unit 12 and device 3 has not been obtained, the duration of the determination by determination unit 13 that an arc has occurred is longer than the second threshold value (threshold time Th1). Accordingly, in the third determination example, determination unit 13 determines that an arc caused by a disconnection or partial disconnection in power line L1 has occurred, i.e., that an arc fault has occurred, without referencing the quality information obtained by second obtainment unit 12. In this way, when determination unit 13 has determined, for the second threshold (threshold time Th1) amount of time or longer, that an arc fault has occurred based on a measurement result obtained by first obtainment unit 11, it determines that an arc fault has occurred regardless of the quality information obtained by second obtainment unit 12.

Notification unit 14 notifies the surrounding area that an arc fault has occurred by, for example, lighting a lamp or sounding a buzzer. Notification unit 14 may also notify that an arc fault has occurred by transmitting information indicating such to an information terminal of the owner or manager of arc detection system 100. Information terminals can include, for example, portable terminals such as smartphones or tablets, as well as personal computers.

Shutoff unit 15 stops the current flowing in power line L1 when determination unit 13 determines that an arc fault has occurred. This extinguishes any arc discharge that may have occurred due to the arc fault.

For example, shutoff unit 15 stops the current flowing in power line L1 by controlling a switch connected to power line L1. The switch is, for example, a mechanical or semiconductor switch. Examples of mechanical switches include relays and breakers, and examples of semiconductor switches include transistors and diodes.

The switch connected to power line L1 may be a switch directly connected to power line L1 or indirectly connected to power line L1. For example, the switch is a switch that realizes the AC/DC conversion function in AC/DC converter 21. Even though the switch is not directly connected to power line L1, it is indirectly connected to power line L1, and thus is considered a switch connected to power line L1. For example, shutoff unit 15 stops the current flowing in power line L1 by controlling the switch to stop the switching operation of the switch.

The switch may be configured to turn power supply 2 on and off. In such cases, shutoff unit 15 stops the current flowing in power line L1 by controlling the switch to turn power supply 2 off.

The switch may be provided on power line L1, and the switch may be configured to open or close power line L1. For example, shutoff unit 15 may stop the current flowing in power line L1 by controlling the switch to open power line L1.

[Operations]

Figure 3:
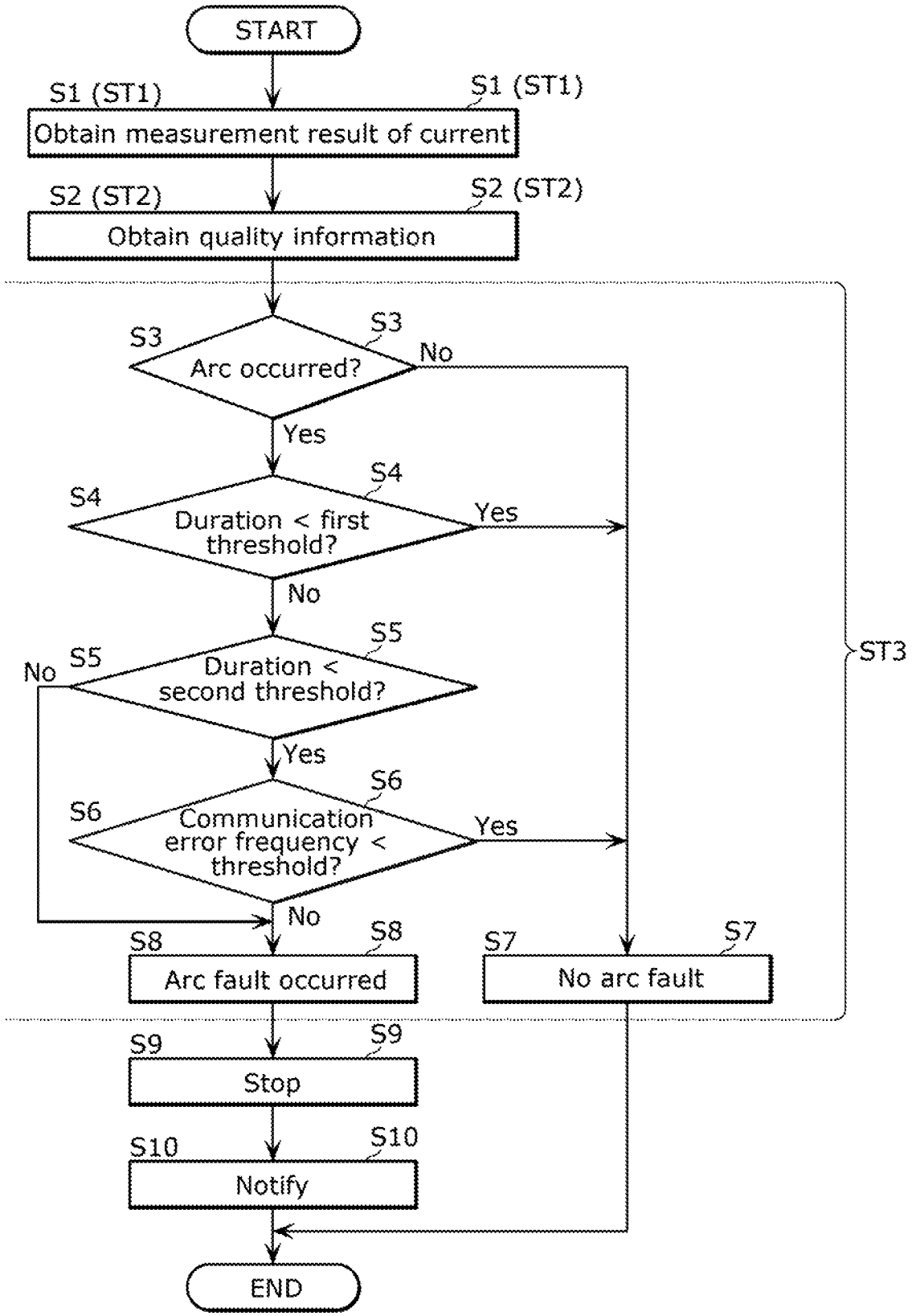
FIG. 3 is a flowchart illustrating an operation example of the arc detection system according to an embodiment of the present disclosure.

Hereinafter, one example of arc detection system 100 according to the embodiment will be described with reference to FIG. 3. FIG. 3 is a flowchart illustrating an operation example of arc detection system 100 according to the embodiment.

First, first obtainment unit 11 obtains the measurement result of current I1 from current meter 22 at predetermined intervals (S1). Process S1 corresponds to first obtainment step ST1 of the arc detection method. Next, second obtainment unit 12 obtains quality information from each device 3 through power line communication with each device 3 (S2). Process S2 corresponds to second obtainment step ST2 of the arc detection method. Then, determination unit 13 first determines whether or not an arc has occurred based on components in a specific frequency band of the measurement result of current I1 obtained by first obtainment unit 11 (S3). Here, determination unit 13 performs a frequency analysis of the measurement result of current I1 obtained by first obtainment unit 11 to make the determination.

If determination unit 13 determines that an arc has occurred (Yes in S3), it monitors the duration of the determination that an arc has occurred (S4). However, if determination unit 13 determines that no arc has occurred (No in S3), it determines that no arc fault has occurred (S7).

When determination unit 13 determines that an arc has occurred, if the duration is less than the first threshold (Yes in S4), determination unit 13 determines that no arc fault has occurred (S7). If the duration is greater than or equal to the second threshold (No in S4, No in S5), determination unit 13 determines that an arc fault has occurred (S8). However, if the duration time is greater than or equal to the first threshold (No in S4) and less than the second threshold (Yes in S5), determination unit 13 references the quality information obtained by second obtainment unit 12 to monitor whether the level of communication quality with each device 3 at determination time t1 is low (i.e., whether the frequency of communication errors is greater than or equal to the threshold) (S6).

If the frequency of communication errors is less than the threshold at determination time t1 for all devices 3 (Yes in S6), determination unit 13 determines that no arc fault has occurred (S7). However, if the frequency of communication errors is greater than or equal to the threshold at determination time t1 for any device 3 (No in S6), determination unit 13 determines that an arc fault has occurred (S8). Processes S3 through S8 correspond to determination step ST3 of the arc detection method.

If determination unit 13 determines that an arc fault has occurred (S8), shutoff unit 15 stops the power supply from power supply 2 to power line L1 by stopping the current flowing in power line L1 (S9). Notification unit 14 then notifies of the occurrence of the arc fault (S10). However, if determination unit 13 determines that no arc fault has occurred (S7), arc detection system 100 ends the process. The above series of processes S1 through S10 are thereafter repeated.

[Advantages]

Hereinafter, the advantages of arc detection system 100 according to the embodiment will be explained by way of comparison with a comparative arc detection system. The comparative arc detection system differs from arc detection system 100 according to the embodiment in that it does not include second obtainment unit 12. Stated differently, the comparative arc detection system differs from arc detection system 100 according to the embodiment in that it immediately determines that an arc fault has occurred when the measurement result of current I1 obtained by first obtainment unit 11 contains a first predetermined value of specific frequency band components or more.

First, conditions required for an arc detection system will be described. If an arc occurs due to a disconnection or partial disconnection in power line L1 and is left unattended, the disconnected or partially disconnected part may generate excessive heat and possibly ignite, leading to a fire. It is therefore important for the arc detection system to detect the occurrence of arcs (i.e., arc faults) as soon as possible and to stop the supply of power to power line L1 before the situation escalates to a point where a fire can occur. For example, the Underwriters Laboratories (UL) standard requires that arc faults be detected within 2 seconds of occurrence of an arc.

Although the comparative arc detection system is capable of detecting the occurrence of arc faults, it determines that an arc fault has occurred not only when an arc is caused by a disconnection or partial disconnection in power line L1, but also when an arc is caused by chattering. Stated differently, the comparative arc detection system incorrectly determines that an arc fault has occurred even when the arc is unlikely to cause an arc fault.

The comparative arc detection system determines that an arc fault has occurred even when there is an abrupt fluctuation in load 31 included in device 3. Stated differently, the comparative arc detection system incorrectly determines that an arc fault has occurred even when no arc has actually occurred. In this way, the comparative arc detection system determines that an arc fault has occurred each time an arc occurs and each time an abrupt fluctuation occurs in load 31, which may be less user-friendly. For example, this could lead to the user being notified that an arc fault has occurred each time device 3 is attached to or detached from power line L1 and each time device 3 is turned on or off, which would be bothersome to the user. Assume, for example, that the comparative arc detection system is configured to automatically stop supplying power from power supply 2 to power line L1 when it determines that an arc fault has occurred. With this configuration, the supply of power to power line L1 is stopped each time device 3 is attached to or detached from power line L1 and each time device 3 is turned on or off, which is also bothersome to the user.

However, since arc detection system 100 according to the embodiment includes second obtainment unit 12, determination unit 13 can know the level of power line communication quality with device 3. Here, the quality of power line communication through power line L1 is affected by the state of power line L1. More specifically, if power line L1 is not degraded, the level of power line communication quality will be higher, while if power line L1 is degraded, the level of power line communication quality will be lower. If the degradation of power line L1 progresses to the point that there is a disconnection or partial disconnection in some parts of power line L1, the level of power line communication quality decreases as the frequency of communication errors increases above the threshold. Stated differently, determination unit 13 can determine whether or not a disconnection or partial disconnection is likely to occur in power line L1 by knowing the level of power line communication quality with device 3.

Arc detection system 100 according to the embodiment therefore determines that an arc fault has occurred when an arc is caused by a disconnection or partial disconnection in power line L1, and generally does not determine that an arc fault has occurred in other cases.

Stated differently, arc detection system 100 according to the embodiment is unlikely to determine that an arc fault has occurred when an arc occurs due to chattering and when an abrupt fluctuation occurs in load 31. In other words, arc detection system 100 according to the embodiment has the advantage that false detection of arcs due to chattering and abrupt fluctuations in load 31 as the occurrence of an arc fault can be easily prevented, thus making it easier to prevent false detection of occurrences of arc faults.

Therefore, with arc detection system 100 according to the embodiment, the above-described events that could possibly occur in the comparative arc detection system are not likely to occur. Stated differently, arc detection system 100 according to the embodiment has the advantage of being user-friendly because it can notify the user or stop the supply of power to power line L1 only when an arc fault occurs, which is considered to be an event that has a particularly large impact on the user.

[Variations]

Although an embodiment has been described above, the present invention is not limited to this embodiment. Hereinafter, examples of variations of the embodiment will be given. The variations described below may be combined where appropriate.

In the embodiment, current meter 22 is provided as a separate device from arc detection system 100, but current meter 22 may be provided in arc detection system 100.

In the embodiment, second obtainment unit 12 communicates at regular intervals with devices 3 that are connected to power line L1 and operating, but this example is non-limiting. For example, second obtainment unit 12 may communicate with devices 3 on an irregular basis. For example, if the number of times second obtainment unit 12 transmits a request signal per unit of time toward device 3 is constant, the interval at which request signals are transmitted may be irregular within a unit of time.

In the embodiment, arc detection system 100 is provided in power supply 2, but this example is non-limiting. For example, arc detection system 100 may be connected to power line L1 as a separate device from power supply 2. In such cases, if arc detection system 100 is configured to communicate with power supply 2 via wired, wireless, or power line communication, it is possible to give instructions to power supply 2 according to the determination results of determination unit 13.

In the embodiment, determination unit 13 extracts components in a specific frequency band by performing frequency analysis on the measurement result of current I1 obtained by first obtainment unit 11, but this example is non-limiting. For example, instead of performing frequency analysis, determination unit 13 may extract frequency components in a specific frequency band by passing the measurement result of current I1 obtained by first obtainment unit 11 through a filter (for example, a bandpass filter).

In the embodiment, first obtainment unit 11 obtains the measurement result of current I1, but it may also obtain a measurement result of voltage V1. In such cases, first obtainment unit 11 obtains the measurement result of voltage V1 by sampling at predetermined intervals (i.e., on a sampling cycle) by a voltmeter instead of current meter 22. Stated differently, first obtainment unit 11 obtains the measurement result of voltage V1 from a voltmeter at predetermined intervals. The voltmeter is provided in power supply 2 and measures the voltage between the positive and negative power lines of power line L1 (i.e., measures voltage V1 in power line L1). The voltmeter does not need to be provided in power supply 2 and may be a separate device from power supply 2.

In such cases, determination unit 13 determines whether or not an arc is occurring based on components in a specific frequency band of the measurement result of voltage V1 obtained by first obtainment unit 11. More specifically, determination unit 13 performs a frequency analysis of the measurement result of voltage V1 obtained by first obtainment unit 11. Determination unit 13 then refers to the calculated frequency spectrum and determines that an arc has occurred if the measurement result of voltage V1 contains a first predetermined value of specific frequency band components or more. The specific frequency band is, for example, a band that includes the frequency of noise generated when an arc fault occurs. In one example, the specific frequency band is the band of tens of kHz, which is a relatively high frequency band. Note that the frequency of the noise generated in the above case can be obtained experimentally.

In the embodiment, second obtainment unit 12 is provided in communication module 20, which is connected to power line L1 separately from power supply 2, but this example is non-limiting. For example, second obtainment unit 12 may be provided in power supply 2. In such cases, communication module 20 is not needed in arc detection system 100.

In the embodiment, determination unit 13 determines that an arc fault has occurred if the duration of the determination that an arc has occurred is greater than or equal to the second threshold (threshold time Th1), regardless of the fluctuation information obtained by second obtainment unit 12, but this example is non-limiting. For example, determination unit 13 may determine that an arc fault has occurred if the measurement result contains a second predetermined value of specific frequency band components or more (second predetermined value>first predetermined value), regardless of the fluctuation information obtained by second obtainment unit 12.

In the embodiment, a plurality of devices 3 may be connected to power line L1. In such cases, determination unit 13 can estimate to some extent which location on power line L1 caused the arc fault by referencing the quality information for each device 3. Stated differently, if determination unit 13 determines that an arc fault has occurred, it may estimate the location where the arc fault occurred based on the quality information for each device 3 obtained by second obtainment unit 12.

For example, assume that device 3 named "A" and device 3 named "B" are connected to power line L1. When determination unit 13 determines that an arc fault has occurred, assume that the frequency of communication errors is less than the threshold for device 3 named "A" and greater than the threshold for device 3 named "B". In such cases, determination unit 13 estimates that an arc fault has occurred between the location at which device 3 named "A" is connected on power line L1 and the location at which device 3 named "B" is connected.

In the embodiment, shutoff unit 15 stops the current flowing in power line L1 when determination unit 13 determines that an arc fault has occurred, but this example is non-limiting. For example, shutoff unit 15 may be configured to individually turn off devices 3 when determination unit 13 determines that an arc fault has occurred. This can be achieved, for example, by providing device 3 with a DC/DC converter circuit and having shutoff unit 15 send a command to device 3 for turning off the switching elements of the DC/DC converter circuit. With this, it is possible to take measures such as turning off only those devices 3 related to the arc fault and keeping other devices 3 in operation.

In the embodiment, arc detection system 100 is used in DC distribution network 200, but this example is non-limiting. For example, arc detection system 100 may be used in an AC distribution network. In such cases, power supply 2 is an AC power supply.

For example, the present invention can be realized not only as arc detection system 100, but also as an arc detection method that includes steps (processes) performed by elements of arc detection system 100.

More specifically, the arc detection method includes first obtainment step ST1, second obtainment step ST2, and determination step ST3. In first obtainment step ST1, a measurement result of current I1 flowing in power line L1 or voltage V1 in power line L1 to which power is supplied from power supply 2 is obtained. In second obtainment step ST2, quality information about the quality of communication with devices 3 connected to power line L1 is obtained through power line communication with devices 3 via power line L1. In determination step ST3, whether or not an arc fault has occurred in power line L1 is determined based on components in a specific frequency band of the measurement result obtained in first obtainment step ST1 and the quality information obtained in second obtainment step ST2.

For example, these steps may be performed by a computer (a computer system) including one or more processors. The present invention can be realized as a program for causing the computer to execute the steps included in the method. The present invention can further be realized as a non-transitory computer-readable recording medium, such as a CD-ROM, recorded with the program. More specifically, the program causes one or more processors to execute the arc detection method described above.

Although at least part of arc detection system 100 in each of the above embodiments is realized as software in a microcontroller, it may also be realized as software in a general-purpose computer such as a personal computer. Furthermore, at least part of arc detection system 100 may be realized as hardware via dedicated electronic circuitry of A/D converters, logic circuits, gate arrays, D/A converters, etc.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

(Conclusion)

As described above, arc detection system 100 includes first obtainment unit 11, second obtainment unit 12, and determination unit 13. First obtainment unit 11 obtains a measurement result of current I1 flowing in power line L1 or voltage V1 in power line L1 to which power is supplied from power supply 2. Second obtainment unit 12 obtains quality information about the quality of communication with devices 3 connected to power line L1 through power line communication with devices 3 via power line L1. Determination unit 13 determines whether or not an arc fault has occurred in power line L1 based on components in a specific frequency band of the measurement result obtained by first obtainment unit 11 and the quality information obtained by second obtainment unit 12.

Arc detection system 100 configured in this manner has the advantage that false detection of arcs occurring when device 3 is attached or detached to or from power line L1 and abrupt fluctuations in load 31 as the occurrence of an arc fault can be easily prevented, thus making it easier to prevent false detection of occurrences of arc faults.

For example, in arc detection system 100, when determination unit 13 determines that an arc has occurred based on the measurement result obtained by first obtainment unit 11 and, at the time of the determination, the frequency of communication errors obtained by second obtainment unit 12 is greater than or equal to a threshold, determination unit 13 determines that an arc fault has occurred.

Arc detection system 100 configured in this manner has the advantage that it is easier to detect a disconnection or partial disconnection in power line L1 by referencing the frequency of communication errors, thus making it easier to prevent false detection of the occurrence of arc faults.

For example, in arc detection system 100, when determination unit 13 has determined, for a threshold amount of time Th1 or longer, that an arc has occurred based on the measurement result obtained by first obtainment unit 11, determination unit 13 determines that the arc fault has occurred regardless of the quality information obtained by second obtainment unit 12.

Arc detection system 100 configured in such a manner has the advantage that it is easier to determine that an arc fault has occurred at an early stage compared to when the quality information is referenced.

For example, in arc detection system 100, a plurality of devices 3 are connected to power line L1. When determination unit 13 determines that an arc fault has occurred, it estimates the location where the arc fault occurred based on the quality information for each device 3 obtained by second obtainment unit 12.

Arc detection system 100 configured in this manner has the advantage that the location of the arc fault can be estimated, making it easier to take measures against the arc fault.

For example, the arc detection method includes first obtainment step ST1, second obtainment step ST2, and determination step ST3. In first obtainment step ST1, a measurement result of current I1 flowing in power line L1 or voltage V1 in power line L1 to which power is supplied from power supply 2 is obtained. In second obtainment step ST2, quality information about the quality of communication with devices 3 connected to power line L1 is obtained through power line communication with devices 3 via power line L1. In determination step ST3, whether or not an arc fault has occurred in power line L1 is determined based on components in a specific frequency band of the measurement result obtained in first obtainment step ST1 and the quality information obtained in second obtainment step ST2.

An arc detection method configured in this manner has the advantage that false detection of arcs occurring when device 3 is attached or detached to or from power line L1 and abrupt fluctuations in load 31 as the occurrence of an arc fault can be easily prevented, thus making it easier to prevent false detection of occurrences of arc faults.

For example, a non-transitory computer-readable recording medium has recorded thereon a program for causing one or more processors to execute the arc detection method described above.

A recording medium configured in this manner has the advantage that false detection of arcs occurring when device 3 is attached or detached to or from power line L1 and abrupt fluctuations in load 31 as the occurrence of an arc fault can be easily prevented, thus making it easier to prevent false detection of occurrences of arc faults.

The invention claimed is:

1. An arc detection system comprising:
a first obtainment unit configured to obtain a measurement result of current flowing in a power line to which power is supplied from a power supply or a measurement result of voltage in the power line;
a second obtainment unit configured to obtain quality information about quality of communication with a device, which is detachably connected to the power line, through power line communication with the device via the power line, wherein the power supply supplies the power to the device via the power line so that the device operates; and a determination unit configured to determine whether or not an arc fault has occurred in the power line based on components in a specific frequency band of the measurement result obtained by the first obtainment unit and the quality information obtained by the second obtainment unit.

2. The arc detection system according to claim 1, wherein the second obtainment unit is configured to obtain a frequency of communication errors as the quality information, and when the determination unit determines that an arc has occurred based on the measurement result obtained by the first obtainment unit and, at a time of the determination, the frequency of communication errors obtained by the second obtainment unit is greater than or equal to a threshold, the determination unit is configured to determine that the arc fault has occurred.

3. The arc detection system according to claim 1, wherein when the determination unit has determined, for a threshold amount of time or longer, that an arc has occurred based on the measurement result obtained by the first obtainment unit, the determination unit is configured to determine that the arc fault has occurred regardless of the quality information obtained by the second obtainment unit.

4. The arc detection system according to claim 1, wherein the device connected to the power line comprises a plurality of devices connected to the power line, and when the determination unit has determined that the arc fault has occurred, the determination unit is configured to estimate a location where the arc fault occurred based on the quality information for each of the plurality of devices obtained by the second obtainment unit.

5. The arc detection system according to claim 1, wherein:
the second obtainment unit is configured to obtain a frequency of communication errors as the quality information, and when the determination unit has determined that the arc fault has occurred based on the measurement result obtained by the first obtainment unit, if the frequency of communication errors obtained by the second obtainment unit at a time of the determination is less than a threshold, the determination unit is configured to determine that the arc fault has not occurred.

6. The arc detection system according to claim 1, wherein the device includes a load driven by the power supplied from the power supply.

7. The arc detection system according to claim 1, wherein the power supply includes an AC/DC converter.

8. The arc detection system according to claim 7, further comprising:
the power supply.

9. An arc detection method comprising:
obtaining a measurement result of current flowing in a power line to which power is supplied from a power supply or a measurement result of voltage in the power line;

obtaining quality information about quality of communication with a device, which is detachably connected to the power line, through power line communication with the device via the power line, wherein the power supply supplies the power to the device via the power line so that the device operates; and determining whether or not an arc fault has occurred in the power line based on components in a specific frequency band of the measurement result obtained and the quality information obtained.

10. A non-transitory computer-readable recording medium having recorded thereon a program for causing one or more processors to execute the arc detection method according to claim 9.

11. The arc detection method according to claim 9, wherein:
in the obtaining of the quality information, a frequency of communication errors is obtained as the quality information, and when it is determined in the determining that the arc fault has occurred based on the measurement result obtained in the obtaining of the measurement result, if the frequency of communication errors obtained in the obtaining of the quality information at a time of the determination is less than a threshold, the determining determines that the arc fault has not occurred.

12. The arc detection method according to claim 9, wherein the power supply includes an AC/DC converter.

13. The arc detection method according to claim 9, wherein the device includes a load driven by the power supplied from the power supply.

* * * * *